United States Patent
Park et al.

(10) Patent No.: US 7,687,292 B2
(45) Date of Patent: Mar. 30, 2010

(54) LIGHT EMITTING DIODE PACKAGE WITH METAL REFLECTIVE LAYER AND METHOD OF MANUFACTURING THE SAME

(75) Inventors: Jung Kyu Park, Seoull (KR); Seon Goo Lee, Kyungki-do (KR); Kyung Taeg Han, Kyungki-do (KR); Seong Yeon Han, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 12/153,719

(22) Filed: May 23, 2008

(65) Prior Publication Data

US 2008/0233666 A1 Sep. 25, 2008

Related U.S. Application Data

(62) Division of application No. 11/455,648, filed on Jun. 20, 2006, now abandoned.

(30) Foreign Application Priority Data

Jun. 20, 2005 (KR) ...................... 10-2005-0053163

(51) Int. Cl.
*H01L 21/56* (2006.01)
(52) U.S. Cl. ............................ 438/33; 438/26; 438/29; 257/E21.499; 257/E21.502; 257/E21.503
(58) Field of Classification Search ................... 438/26, 438/29, 33; 257/E21.499, E21.502, E21.503
See application file for complete search history.

(56) References Cited

U.S. PATENT DOCUMENTS

| 6,069,440 | A | 5/2000 | Shimizu et al. |
| 6,599,768 | B1 | 7/2003 | Chen |
| 6,638,780 | B2 | 10/2003 | Fukasawa et al. |
| 7,227,190 | B2 | 6/2007 | Yasukawa et al. |
| 2002/0187570 | A1 | 12/2002 | Fukasawa et al. |
| 2003/0132495 | A1* | 7/2003 | Mills et al. ................... 257/433 |
| 2003/0189829 | A1 | 10/2003 | Shimizu et al. |
| 2004/0069993 | A1* | 4/2004 | Murano ....................... 257/79 |
| 2005/0122720 | A1 | 6/2005 | Shimonaka et al. |
| 2005/0264194 | A1* | 12/2005 | Ng et al. ..................... 313/512 |

FOREIGN PATENT DOCUMENTS

JP 2000-164934 6/2000

(Continued)

OTHER PUBLICATIONS

Chinese Office Action, with English Translation, issued in corresponding Chinese Patent Application No. 2006100922828, mailed on Sep. 14, 2007.

(Continued)

*Primary Examiner*—Kiesha R Bryant
*Assistant Examiner*—Minchul Yang
(74) *Attorney, Agent, or Firm*—McDermott Will & Emery LLP (57) ABSTRACT

The invention relates to an LED package having a metal reflective layer for focusing and emitting light through a side of the package, and a manufacturing method of the same. The LED package includes a substrate with an electrode formed thereon, a light emitting diode chip disposed on the substrate, and an encapsulant covering the LED chip and the substrate to protect the LED chip. The LED package also includes a metal reflective layer surrounding side surfaces of the encapsulant to form a light transmitting surface on a top surface of the encapsulant. The invention minimizes light loss, improves luminance, can be mass-produced as a PCB type, and adopts EMC transfer molding to minimize irregular color distribution, thereby improving optical quality.

7 Claims, 7 Drawing Sheets

FOREIGN PATENT DOCUMENTS

| | | |
|---|---|---|
| JP | 2000-196153 | 7/2000 |
| JP | 2001-094129 | 4/2001 |
| JP | 2001-160629 | 6/2001 |
| JP | 2002-050798 | 2/2002 |
| JP | 2002-314140 | 10/2002 |
| JP | 2002-368281 | 12/2002 |
| JP | 2003-046140 | 2/2003 |
| JP | 2003-218399 | 7/2003 |
| JP | 2004-134699 | 4/2004 |
| JP | 2004-528472 | 9/2004 |
| JP | 2005-026276 | 1/2005 |
| WO | WO 02/98981 A1 | 12/2002 |
| WO | WO 2004/021459 A1 | 3/2004 |

OTHER PUBLICATIONS

Korean Office Action issued in corresponding Korean Patent Application No. 10-2005-0053163 dated Jun. 26, 2006.

Taiwanese Office Action, with English Translation, issued in Taiwanese Patent Application No. TW 95122015 dated Aug. 25, 2008.

* cited by examiner

LIGHT EMITTING DIODE PACKAGE WITH METAL REFLECTIVE LAYER AND METHOD OF MANUFACTURING THE SAME

CLAIM OF PRIORITY

This application is a Divisional of U.S. application Ser. No. 11/455,648, filed Jun. 20, 2006 now abandoned, and claims the benefit of Korean Patent Application No. 2005-53163 filed on Jun. 20, 2005, in the Korean Intellectual Property Office, the entire disclosures of each of which are incorporated herein by reference.

BACKGROUND OF THE INVENTION

1. Field of the Invention

The present invention relates to a Light Emitting Diode (LED) package having a metal reflective layer for focusing and emitting light through one side of the package, and a method of manufacturing the same. More particularly, the invention relates to an LED package with a metal reflective layer minimized in light loss and improved in luminance, which can be mass-manufactured as a PCB type in a small size unaffected by the size of an LED chip, and is improved in productivity.

2. Description of the Related Art

In general, a mobile phone or PDA adopts a light emitting diode (LED) package in various sizes for a backlight.

As the backlights are becoming slimmer, the LED packages adopted therein are also becoming slimmer these days.

Figure 1:
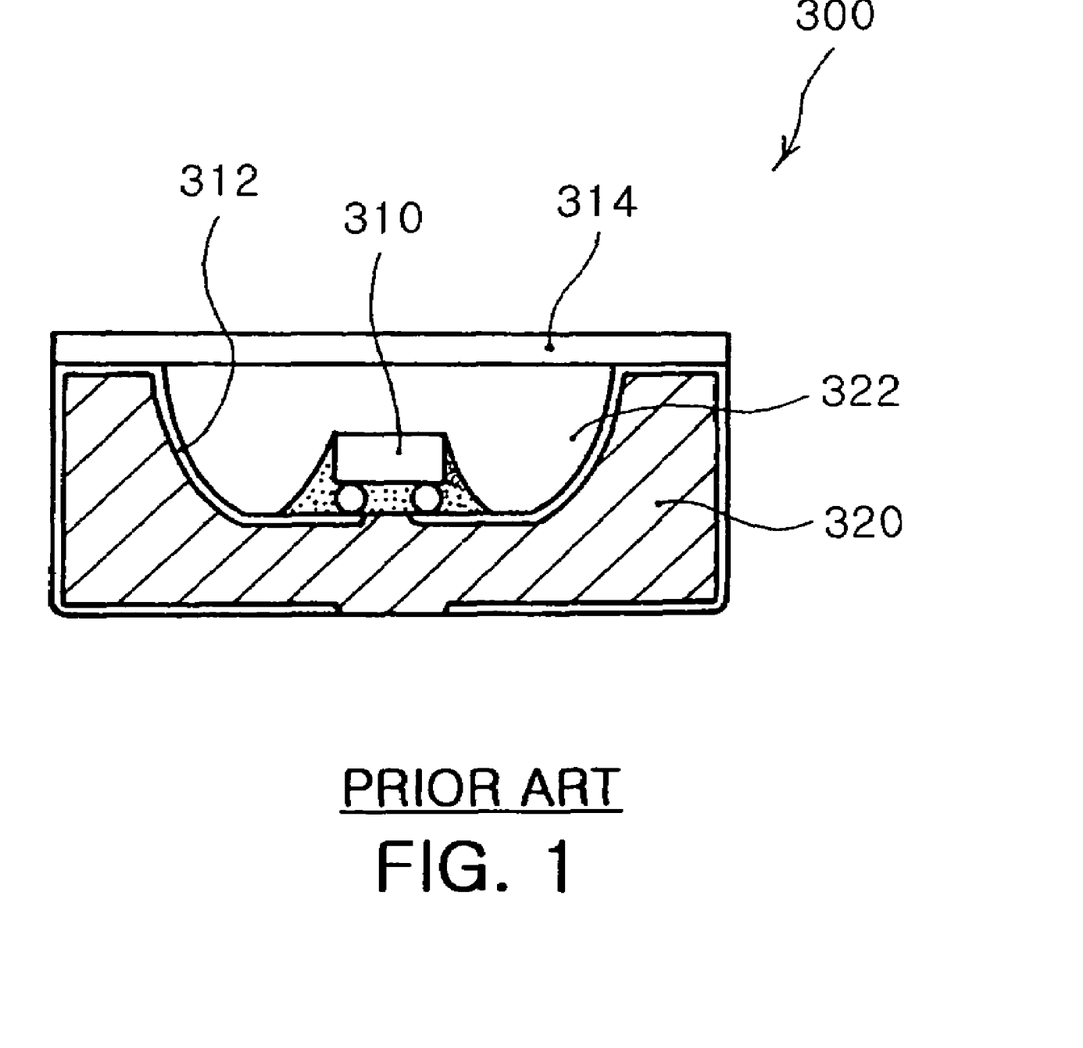
FIG. 1 is a sectional view illustrating an LED package according to the prior art.

The LED package 300 shown in FIG. 1 is described in U.S. Patent No. 2003-0094622, in which a reflective layer 312 is formed of a lead frame for an LED chip 310 mounted in the package 300, and the package is sealed with a sealing plate 314 that covers the LED chip 310 and the reflective layer 312.

In this conventional LED package 300, the reflective layer 312 is made of an Ag-plated layer to focus and emit light from the LED chip 310 through one side of the package.

However, in such a conventional structure, the LED chip 310 is formed in a recess 322 of the substrate, and a separate sealing plate 314 covers the recess 322, and thus limiting automated manufacturing and mass-production.

Figure 2:
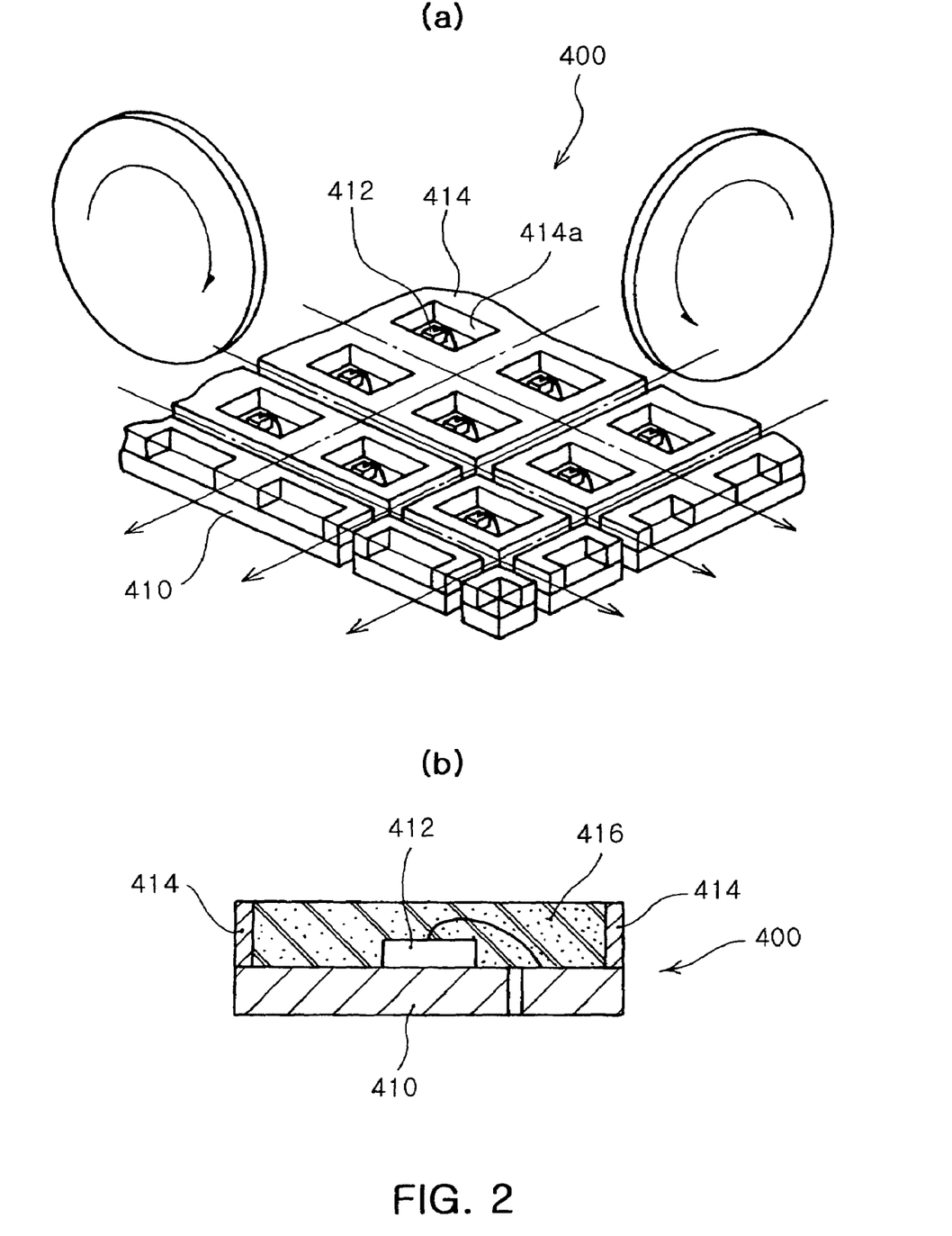
FIG. 2 illustrates another LED package according to the prior art, in which (a) is an explanatory view illustrating cutting a molded part, and (b) is a longitudinal sectional view.

FIGS. 2(a) and 2(b) illustrate a different structure of LED package 400 of the prior art. An LED chip 412 is mounted on a substrate 410, and a molded part 414 with a cavity therein is adhered on the substrate 410. Then, a resin solution with phosphor and epoxy mixed therein is injected into the space 414a to be cured, and the complete structure is diced. However, as an additional process is required to adhere the molded part 414 on the substrate 410, the manufacturing process is not efficient in terms of productivity.

Figure 3:
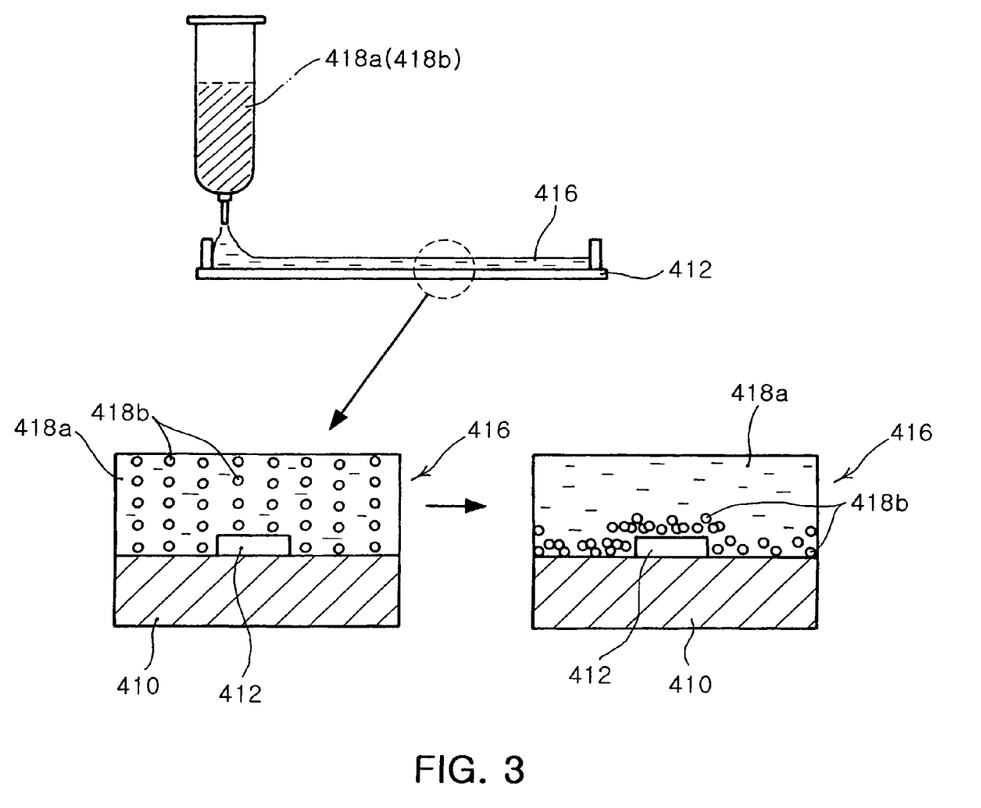
FIG. 3 illustrates a work process with epoxy resin constituting an encapsulant of the LED package according to the prior art.

In addition, as shown in FIG. 3, in the conventional LED package 400, the resin solution with the phosphor and epoxy mixed therein is injected into the space 414a in the molded part 414 and cured for about 1 hour to form an encapsulant 416. In such a curing process, the phosphor in the epoxy 418a of the encapsulant 416 tends to precipitate, causing irregular color distribution. Therefore, such a conventional LED package 400 yields low-uniformity and rather mediocre color development.

SUMMARY OF THE INVENTION

The present invention has been made to solve the foregoing problems of the prior art and therefore an object of certain embodiments of the present invention is to provide an LED package having a metal reflective layer, which does not require a molded part, and thus can have a minimal thickness, and a method of manufacturing the same.

Another object of certain embodiments of the invention is to provide an LED package having a metal reflective layer, which can be mass-produced without being affected by the LED chip size, and can be easily manufactured in a small size, and a method of manufacturing the same.

Further another object of certain embodiments of the invention is to provide an LED package having a metal reflective layer, which adopts Epoxy Molding Compound (EMC) transfer molding to minimize irregular color distribution and enhance uniform color development, and a method of manufacturing the same.

Yet another object of certain embodiments of the invention is to provide an LED package minimized in light loss and improved in luminance, which can be mass-produced and is improved in productivity, and a method of manufacturing the same.

According to an aspect of the invention for realizing the object, there is provided a light emitting diode package for emitting light from a light emitting diode chip in one direction, including: a substrate with an electrode formed thereon; a light emitting diode chip disposed on the substrate; an encapsulant covering the LED chip and the substrate to protect the LED chip; and a metal reflective layer surrounding side surfaces of the encapsulant to form a light transmitting surface on a top surface of the encapsulant.

According to another aspect of the invention for realizing the object, there is provided a method of manufacturing a light emitting diode package for emitting light from a light emitting diode chip in one direction, including steps of: providing a substrate with an electrode formed thereon; disposing a light emitting diode chip on the substrate; forming an encapsulant on the light emitting diode chip and the substrate; cutting the encapsulant; and forming a reflective layer on the encapsulant.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 4:
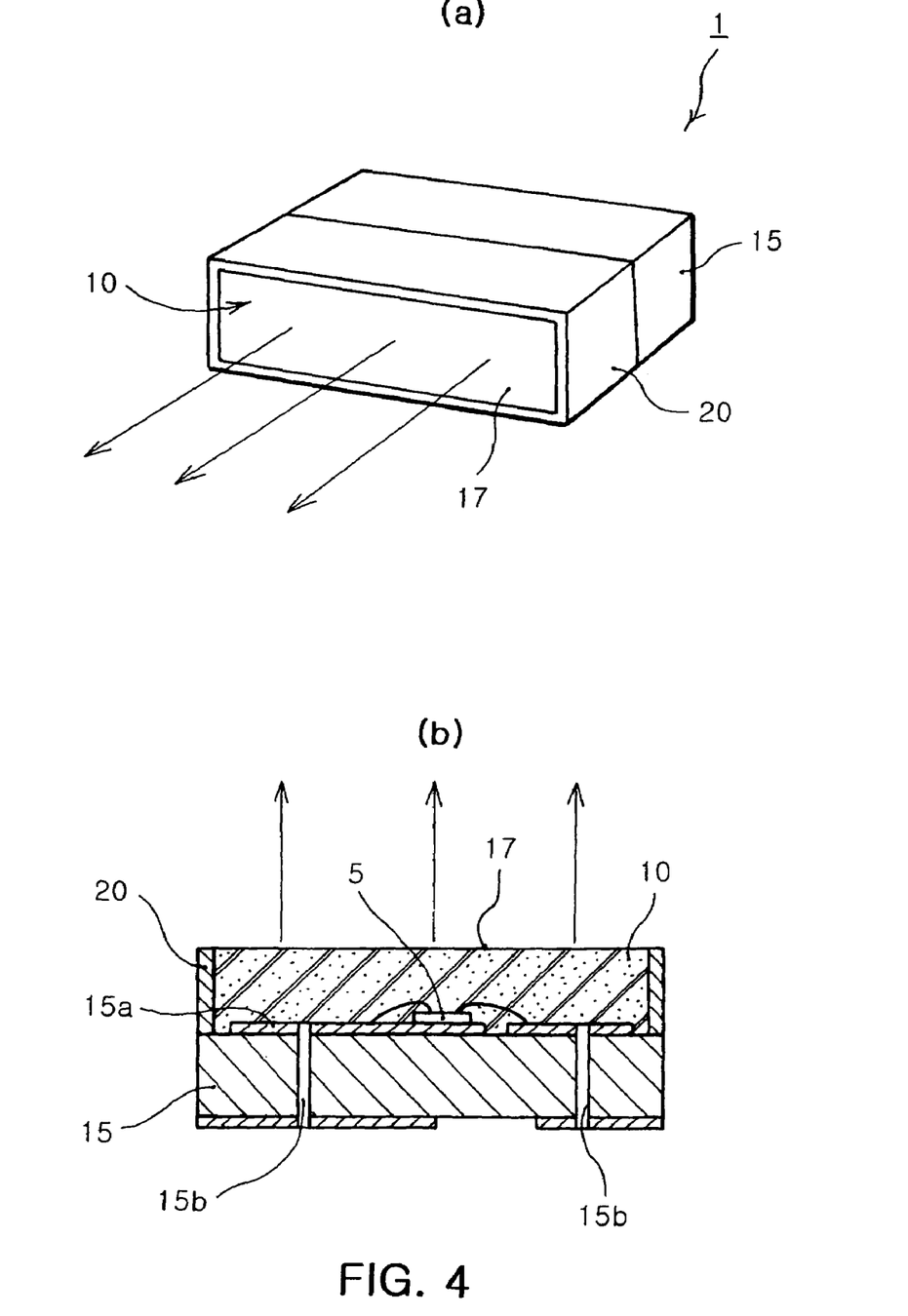
FIG. 4 is a configuration view illustrating an LED package having a metal reflective layer according to the present invention, in which (a) is a perspective view of the exterior, and (b) is a sectional view illustrating the LED package having a light transmitting surface on an upper part thereof.

As shown in FIG. 4, an LED package 1 having a metal reflective layer according to the present invention is for emitting light from an LED chip 5 in one direction of an encapsulant 10.

Light is emitted through a light transmitting surface 17 which is preferably in front and in parallel with a plane where the LED chip 5 is disposed.

The LED package 1 having a metal reflective layer according to the present invention has a substrate with electrodes 15a and 15b formed thereon. The substrate 15 may preferably be a Printed Circuit Board (PCB) or a ceramic substrate having pattern electrodes 15a and vertical electrodes 15b such as vias.

In addition, an LED chip 5 is electrically connected to the electrode 15a and mounted on the substrate 15. The LED chip 5 may be a horizontal type with all of its electric terminals formed only on an upper surface thereof, or a vertical type with the electric terminal formed on upper and lower surfaces thereof.

In addition, an encapsulant 10 is formed on the LED chip 5 and the substrate 15 to cover them. The encapsulant 10 is made by curing epoxy resin, and preferably is formed via Epoxy Molding Compound (EMC) transfer molding using epoxy molding compound with phosphor mixed therein in order to minimize irregular color distribution.

According to the present invention, when the encapsulant 10 is disposed on the LED chip 5 and the substrate 15 in a desired form, a reflective layer 20 is formed on the encapsulant 10 with a light transmitting surface 17 on one surface, i.e., an upper surface of the encapsulant 10 as shown in FIG. 4(b).

The reflective layer 20 is made of metal selected from a group consisting of Al, Au, Ag, Ni, W, Ti and Pt. The reflective layer 20 is formed on side surfaces of the encapsulant 10 via electroless plating or electroplating, or surrounding the entire surfaces of the encapsulant 10 via vacuum deposition, with an upper surface of the encapsulant polished to form the light transmitting surface 17.

Therefore, the reflective layer 20 surrounds the entire side surfaces, except the portion of the light transmitting surface 17, of the encapsulant 10 without any spots missed.

A manufacturing process 100 of an LED package having a metal reflective layer according to the present invention will now be explained hereinafter.

Figure 5:
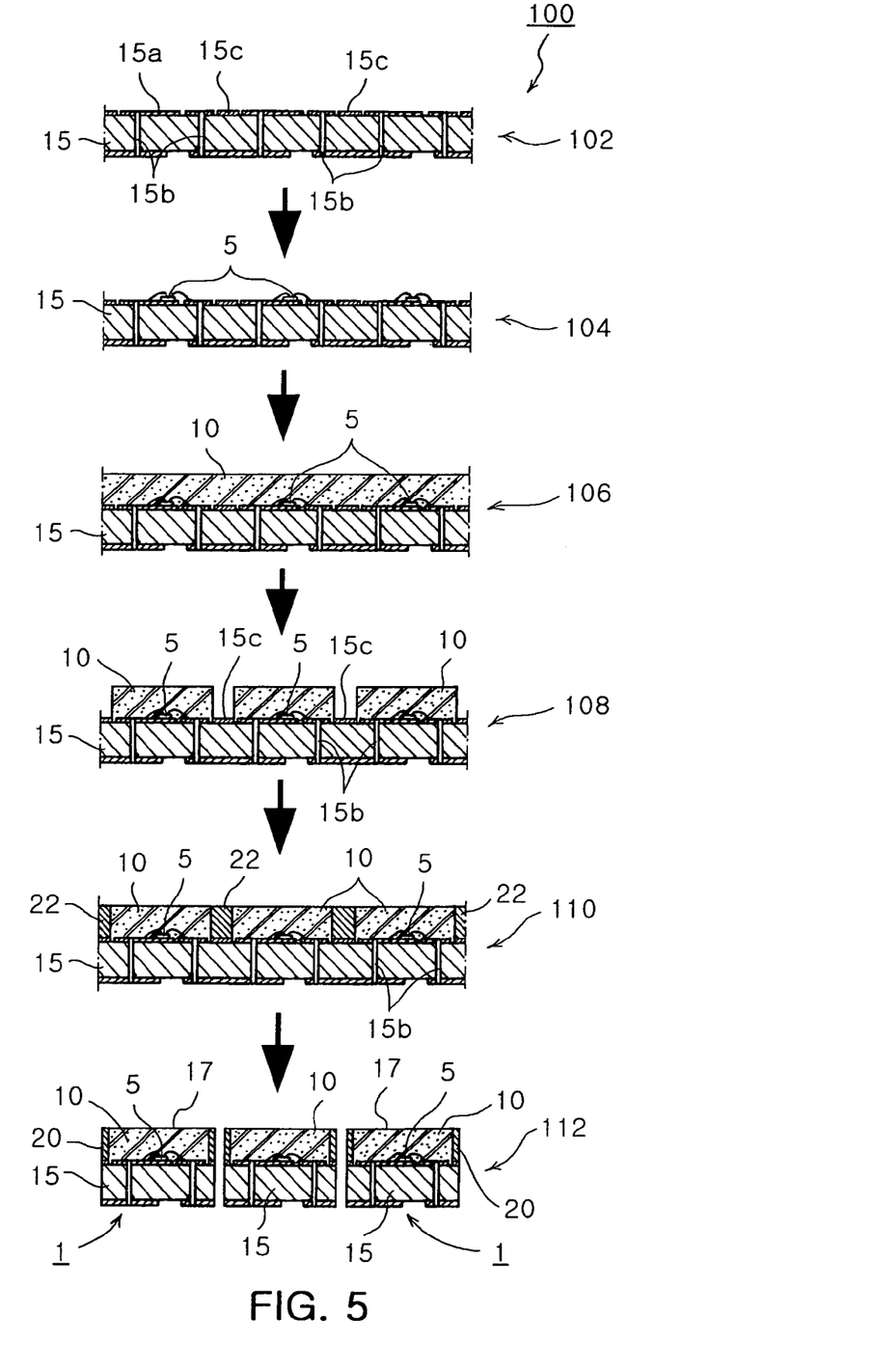
FIG. 5 is a view illustrating the step-by-step process of manufacturing the LED package having a metal reflective layer according to the present invention.

As shown in FIG. 5, the manufacturing process 100 of the LED package having a metal reflective layer according to the present invention starts with a step 102 of providing a substrate 15 with electrodes 15a and 15b formed thereon.

In addition, the substrate 10 is provided with pattern electrodes 15a and vertical electrodes 15b such as vias for supplying power to the LED chips and electrodes 15c for plating a reflective layer later.

The substrate 15 can be a PCB or a ceramic substrate with vertical electrodes 15b such as vias formed thereon, and each of the pattern electrodes 15a connected to the LED chip 5 is electrically connected to each of the vertical electrode 15b such as a via.

In the next step 104, the LED chip 5 is mounted on the substrate 15.

In this step 104, a plurality of LED chips 5 are simultaneously mounted on predetermined locations on one substrate 15, and each of the LED chips 5 is electrically connected to each of the pattern electrodes 15a on the substrate 15 via wires.

In the next step 106, an encapsulant 10 is formed on the LED chip 5 and the substrate 15.

In this step 106, the encapsulant 10 is formed via EMC transfer molding using an epoxy molding compound with phosphor mixed therein in order to minimize irregular color distribution after it is cured.

Figure 7:
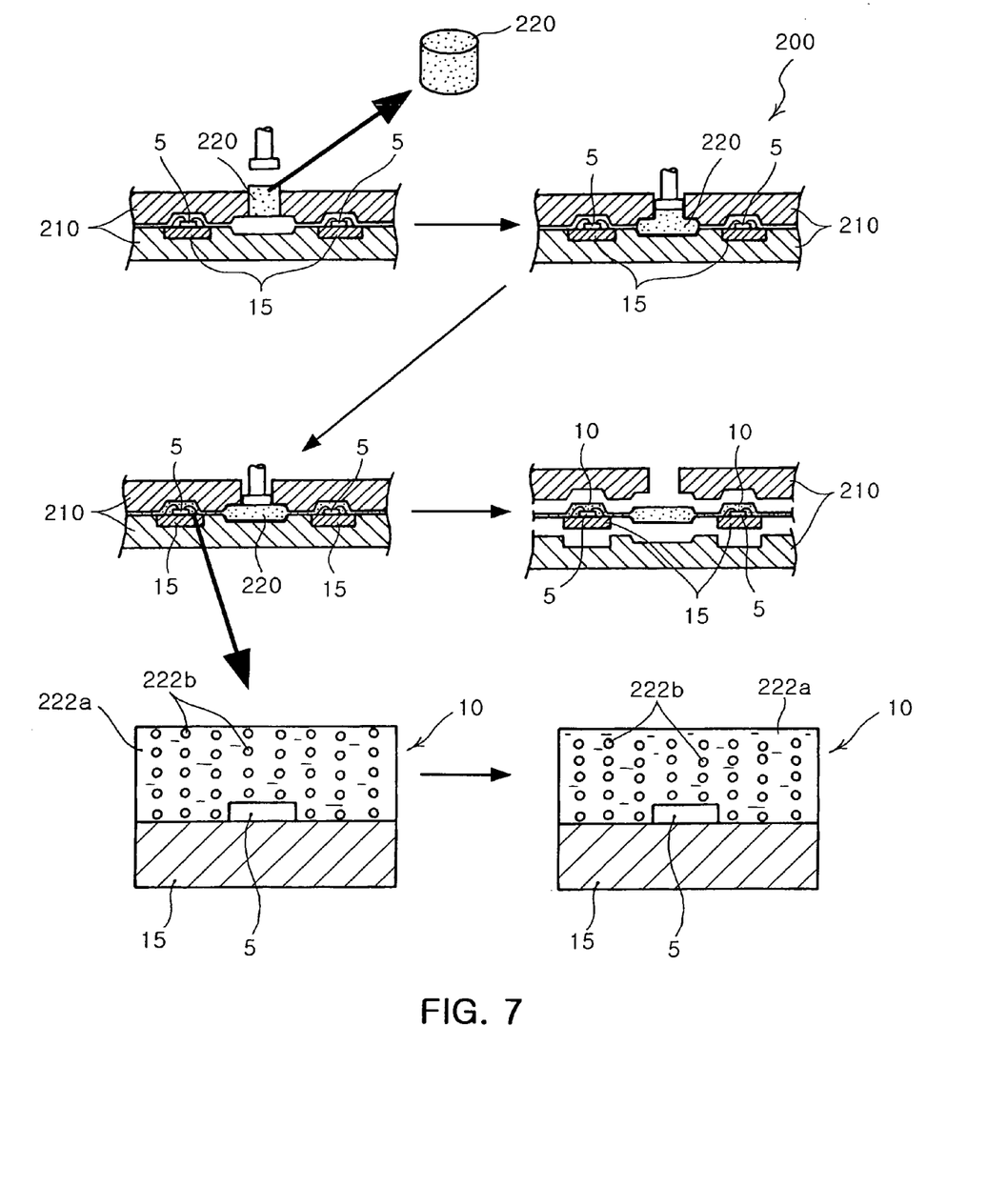
FIG. 7 is a view illustrating EMC transfer molding to form an encapsulant in the manufacturing process of the LED package according to the present invention.

As shown in FIG. 7, in the process of EMC transfer molding 200 adopted for forming the encapsulant 10, the substrates 15 and the LED chips 5 are inserted into a mold 210 maintained at about 150° C. to 190° C., and a solid mixture 220 of transparent EMC and phosphor maintained at about 80° C. to 90° C. is injected into the mold 210. Then, the mixture 220 of the transparent EMC and the phosphor is compressed at 500 to 1000 psi so that the mixture of the transparent EMC and the phosphor changes in its phase from solid to liquid inside the mold 210. This liquid mixture 220 of the transparent EMC and the phosphor flows over the substrate 15 and the LED chip 5 to form the encapsulant 10. After 5 to 7 minutes without applying heat and compression, it is cured in a short time from liquid phase to solid phase.

After the curing is completed, the substrate 15 and the LED chip 5 with the encapsulant 10 formed thereon is separated from the mold 210 to complete the encapsulant 10.

In the encapsulant 10 formed via the above described EMC transfer molding, the phosphor 222b does not precipitate in the transparent EMC 222a, which minimizes irregular color distribution and enhances uniformity of color development.

After the encapsulant 10 is completed, the encapsulant 10 is cut in the next step 108.

In this step 108, in order to form a desired shape of encapsulant 10 for the LED chips 5, only the encapsulant 10 is diced or etched. In this step 108, the encapsulant 10 is formed such that the lower periphery thereof exposes the electrode 15c for plating.

Then, a reflective layer 20 is formed on the encapsulant 10 in the next step 110. The reflective layer 20 is formed as a plated layer 22 on the encapsulant 10 by electroless plating or electro-plating highly reflective metal selected from a group consisting of, for example, Al, Au, Ag, Ni, W, Ti and Pt. At this point, the plated layer 22 is formed integrally with the encapsulant 10 to completely surround the side surfaces of the encapsulant 10, thereby preventing leakage of light.

With the reflective layer 20 formed as just described, the light transmitting surface 17 is formed on an upper surface of the encapsulant 10.

In the next step 112, the plated layer 22 and the substrate 15 are cut horizontally and vertically into individual LED packages to obtain a plurality of LED packages 1.

In this step 112, each of the LED packages 1 has the light transmitting surface 17 formed on an upper surface of the encapsulant 10, and the metal reflective layer 20 surrounds the side surfaces of the encapsulant 10 so that light from the LED chip is leaked only through the light transmitting surface 17.

Figure 6:
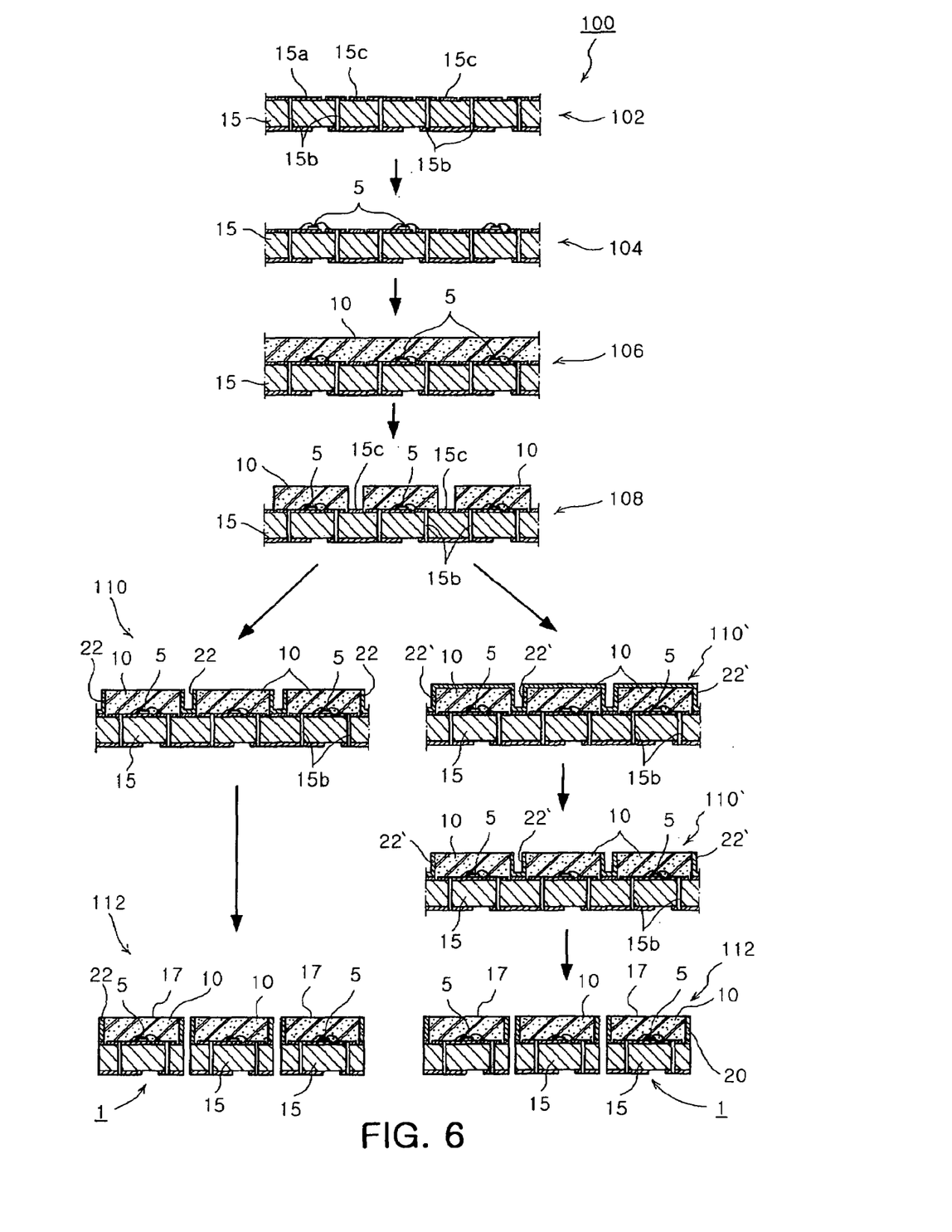
FIG. 6 is a view illustrating the step-by-step process of manufacturing a variation of the LED package having a metal reflective layer.

Alternatively, as shown in FIG. 6, in the step 110 of forming the reflective layer 20 on the encapsulant 10, a sputtered layer 22' is formed via vacuum sputtering using highly reflective metal selected from a group consisting of, for example, Al, Au, Ag, Ni, W, Ti and Pt to surround the outer surfaces of the encapsulant 10. In this case, the sputtered layer 22' is formed integrally with the encapsulant 10 to completely surround the outer surfaces of the encapsulant 10 so as not to allow any leakage of light.

In the next step 110', an upper surface of the sputtered layer 22' is polished to be removed, thus forming the light transmitting surface 17 on an upper surface of the encapsulant 10.

Thus is completed a structure with the light transmitting surfaces 17 formed on upper surfaces of the encapsulant 10.

In the next step 112, the substrate 15 is cut horizontally and vertically into individual LED packages to obtain a plurality of LED packages 1.

Through the above steps, each LED package 1 is completed with the light transmitting surface 17 formed on an upper surface of the encapsulant 10 and the metal reflective layer 20 surrounding the side surfaces of the encapsulant, thereby allowing leakage of light from the LED chip 5 only through the light transmitting surface 17.

According to the present invention as set forth above, a reflective layer and an encapsulant are integrated to minimize the thickness of the LED package, thereby easily applicable to various types of slimmer backlights.

In addition, the present invention does not need a molded part in addition to an encapsulant, allowing a thin, small-sized structure, and adopts highly reflective metal for a reflective layer surrounding the surfaces of the encapsulant, except the portion of the light transmitting surface, to minimize leakage of light.

In addition, in the present invention, the entire process including mounting the LED chip, molding and dicing is conducted on a PCB, enabling mass-production with significantly improved productivity.

Furthermore, the present invention adopts EMC transfer molding using an epoxy molding compound with phosphor mixed therein so that the phosphor does not precipitate after the encapsulant is cured, thereby minimizing irregular color distribution and significantly improving optical quality.

Certain exemplary embodiments of the invention have been explained and shown in the drawings as presently preferred. The invention may, however, be embodied in many different forms and should not be construed as limited to the embodiments set forth herein. While the present invention has been shown and described in connection with the preferred embodiments, it will be apparent to those skilled in the art that modifications and variations can be made without departing from the spirit and scope of the invention as defined by the appended claims.

What is claimed is:

1. A method of manufacturing a light emitting diode package for emitting light from a light emitting diode chip in one direction, comprising steps of:

providing a substrate with an electrode formed thereon;

disposing a plurality of light emitting diode chips on the substrate;

forming an encapsulant on the substrate to encapsulate the light emitting diode chips;

removing portions of the encapsulant to divide the encapsulant into each unit light emitting diode package;

forming a reflective layer in the same shape as the removed portions of the encapsulant by filling the removed portions of the encapsulant with a reflective material; and cutting the reflective layer and the substrate into the each unit light emitting diode package.

2. The method according to claim 1, wherein the step of forming an encapsulant comprises Epoxy Molding Compound (EMC) transfer molding of transparent epoxy molding compound with phosphor mixed therein.

3. The method according to claim 1, wherein the step of forming a reflective layer comprises depositing or plating metal selected from a group consisting of Al, Au, Ag, Ni, W, Ti and Pt.

4. The method according to claim 1, wherein the step of forming a reflective layer comprises forming a sputtered layer made of highly reflective metal around an outer surface of the encapsulant via vacuum sputtering, and removing a portion of the sputtered layer via polishing, thereby forming a light transmitting surface.

5. The method according to claim 2, wherein the EMC transfer molding for forming an encapsulant comprises inserting the substrate and the plurality of light emitting diode chips in a mold maintained at a temperature ranging from 150° C. to 190° C., inserting a solid mixture of transparent epoxy molding compound and phosphor maintained at a temperature ranging from 80° C. to 90° C. into the mold, thereby changing a phase of the mixture of transparent EMC and phosphor from solid to liquid to form an encapsulant.

6. The method according to claim 5, further comprising a step of compressing the solid mixture of transparent epoxy molding compound and phosphor into the mold at 500 psi to 1000 psi.

7. The method according to claim 6, wherein the mixture is cured into the encapsulant without precipitation of the phosphor in the transparent epoxy molding compound in order to minimize irregular color distribution.

\* \* \* \* \*